United States Patent [19]

Wilson

[11] 4,216,388
[45] Aug. 5, 1980

[54] NARROW PULSE ELIMINATOR

[75] Inventor: Robert E. Wilson, Whitehouse Station, N.J.

[73] Assignee: RCA Corporation, New York, N.Y.

[21] Appl. No.: 931,746

[22] Filed: Aug. 7, 1978

[51] Int. Cl.² .......................................... H03K 5/20
[52] U.S. Cl. .................................. 307/234; 307/246; 307/255
[58] Field of Search .................... 307/234, 246, 255

[56] References Cited
U.S. PATENT DOCUMENTS

| | | | |
|---|---|---|---|
| 3,191,058 | 6/1965 | Stone | 307/234 |
| 3,246,247 | 4/1966 | Grindle | 307/255 |
| 3,333,109 | 7/1967 | Updike | 307/255 |
| 3,506,848 | 4/1970 | Beurrier | 307/234 |
| 3,569,737 | 3/1971 | Bauer | 307/246 |
| 3,591,858 | 7/1971 | Boyd | 307/255 |

Primary Examiner—Harold A. Dixon
Attorney, Agent, or Firm—P. J. Rasmussen; A. L. Limberg; A. J. Jacobsen

[57] ABSTRACT

A circuit for eliminating pulses of a minimum predetermined period including a pulsed current source for charging an integrating capacitor, the potential of which is sensed by a threshold detecting circuit. The connection between the current source and the integrating capacitor is selectively controlled by a pair of complementary field effect transistors responsive to the signal including the narrow pulses. The minimum pulse width is determined by a number of device design parameters as well as an externally applied oscillation frequency.

7 Claims, 4 Drawing Figures

NARROW PULSE ELIMINATOR

This invention relates to digital electrical circuitry, in particular circuitry for rejecting pulses having a pulse duration less than a predetermined period.

Many electrical components, such as switches, relays and the like, are designed to open and close circuits and thereby control further circuitry. These components when changing state frequently do not make a single transition from one state to another but rather "chatter" due to the phenomenon of "contact bounce". The effect of chatter or contact bounce is to produce a series of short-duration electrical pulses during the transition period of the state change. In many instances the pulses created by the chattering may undesirably cause false operations in other circuit components designed to receive and process the signal provided by the switch.

It is well known in the art to damp such signals with an RC network having a response time greater than the period that the pulses are expected to occur during state changes. The chatter period may however be as long as 100 ms, in which case the RC components must be of relatively large value, too large to be realized in integrated form on a monolithic die.

In order to eliminate short-duration pulses in integrated circuits a relatively large number of circuits are available. The three most common types of such circuits are those that employ binary counters and gates such as U.S. Pat. No. 3,989,960 issued Nov. 2, 1976 to Y. Kodama and entitled "Chattering Preventive Circuit" which counts down a specific period from a first transistion, then makes a comparison to insure information is still valid; those that employ monostable multivibrators as in U.S. Pat. No. 3,925,682 issued Dec. 9, 1975 to K. Hamada and entitled "Chattering Immune Circuit"; and those that employ latches or bistable elements as described at pages 282–283 in *Digital Integrated Electronics* by H. Taub and D. Schilling, McGraw-Hill, 1977. Each of these three types of circuits have certain drawbacks. For example, the binary counter types are fairly complicated, requiring a relatively large number of devices and a large percentage of the silicon die area. The types using monostable multivibrators also require considerable circuitry and in addition require RC timing elements. In addition, when integrated in MOS technology, the operation of monostables is limited to a somewhat restricted range of timing periods. Finally, the type of chatter prevention circuit employing bistable elements such as set-reset flip flops or cross-coupled NOR gates generally require a provision of two inputs, i.e., one to set the bistable when changing from state "0" to state "1", and one to reset the bistable when returning from state "1" to state "0", which provision involves additional hardware that in some cases is not practical to implement.

The present invention utilizes a pulsed current source and a capacitor to develop a potential which increments in quantum steps at a predetermined step rate. The potential is applied to a threshold detector which responds to the potential exceeding a particular amplitude. The capacitor is alternatively connected to the pulsed current source and a reference potential by a switching circuit under the control of the input signal subject to having undesirable short-duration pulses. The connection between capacitor and pulsed current source must be maintained for a predetermined minimum time period in order for the threshold detector to exhibit a response, which time period is a multiple of the step rate of the current source.

Figure 1:
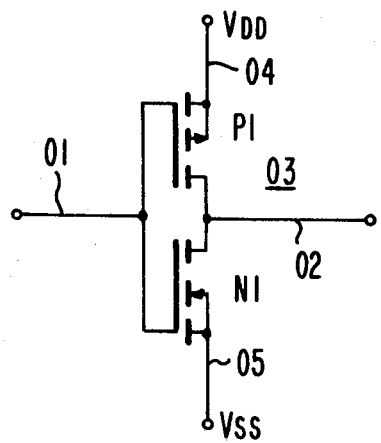
FIG. 1 is a schematic diagram of a typical prior art MOS inverter circuit.
Figure 2:
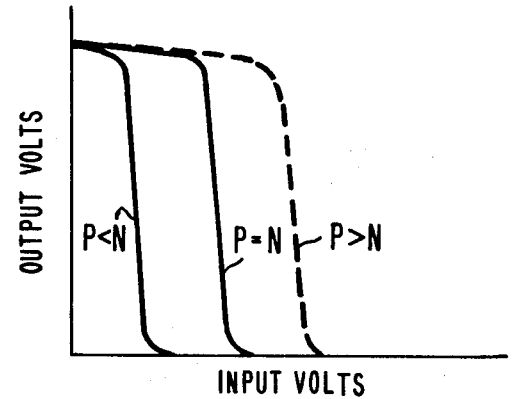
FIG. 2 shows the voltage transfer characteristics for inverter circuits of the type shown in FIG. 1 with the P and N transistors having various conductance ratios.

Referring to FIG. 1, enhancement mode transistors P1 and N1, having their drain electrodes connected to output node 02 and their gate electrodes connected to input node 01, form CMOS inverter circuit 03 having a transfer function typified by the curves in FIG. 2. The switching point of a particular inverter is determined by the turn-on voltage of the individual transistors and the geometric ratio of the channel (the principal conduction path) areas of the P-type and N-type transistors. In light of the foregoing, one can design a particular inverter to switch at a given proportion of the potential applied between terminals designated $V_{DD}$ and $V_{SS}$.

Inverter circuit 03 can therefore be utilized as a threshold device designed to switch states for a potential applied to its input which surpasses a predetermined level.

A further characteristic of inverter 03 where P1 and N1 are relatively low resistance devices is that it can serve as a single-pole double-throw switch connecting node 02 alternately to circuit nodes 04 and 05 under the control of a potential applied to the input node 01. In this type of arrangement the source and sink currents at node 02 are relatively independent, the source current which can be applied to node 02 being determined by the impedance afforded by transistor P1 and the potential difference between nodes 02 and 04 and the sink current which can be drawn from node 02 being determined by the impedance afforded by transistor N1 and the potential difference between nodes 02 and 05. This permits the design of an inverter which will charge and discharge a capacitor load at different rates.

Figure 3:
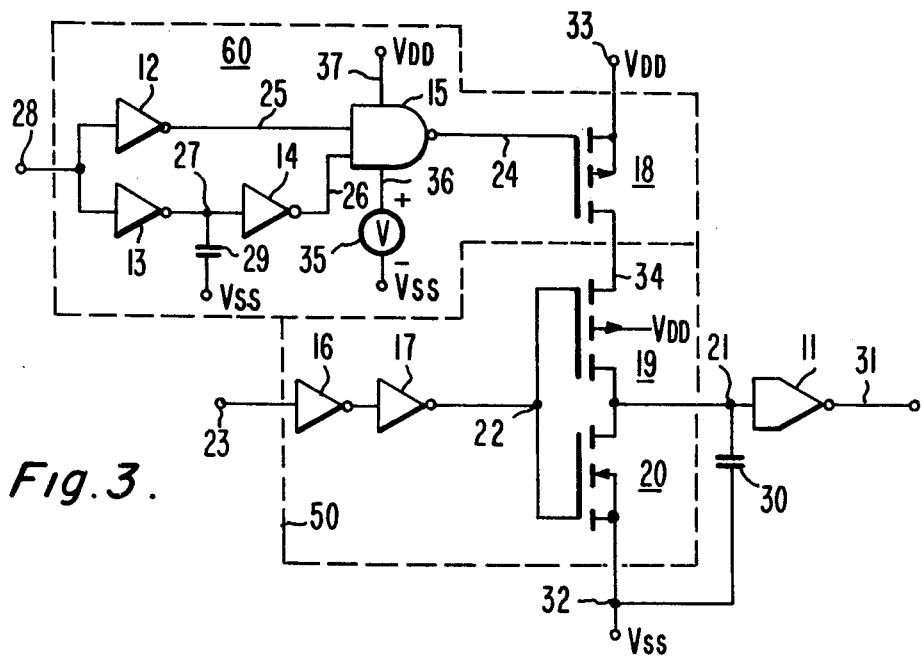
FIG. 3 is a schematic diagram of an embodiment of the present invention.

Referring to FIG. 3, complementary transistors 19 and 20 and inverter circuits 16 and 17 comprise switch means 50 which alternatively connects node 21 to node 32 or 34 under the control of a signal applied to node 23. Transistor 20 and transistor 19 are respectively N-type and P-type enhancement field effect transistors. Transistor 20 is conditioned to conduct when the potential at node 22 is high and transistor 19 is conditioned to conduct when the potential at node 22 is low. Transistor 19 and 20 therefore operate as a single-pole double-throw switch alternatively connecting node 21 to node 32 or 34 and controlled by a single signal applied to node 22. Inverters 16 and 17 included between signal input node 23 and gate control node 22 provide gain for shaping the response at node 22 to the signal applied to node 23 so that the signal applied to node 22 exhibits rapid transitions between high and low states to reduce the likelihood of simultaneous conduction of 19 and 20. The circuitry circumscribed by dashed line 60 is a pulsed current source for applying pulses having a predetermined pulse width and repetition period to node 34. These current pulses are applied, when transistor 19 is conditioned to conduct, to capacitor 30 connected at node 21. The charge associated with these current pulses is integrated on capacitor 30, creating a potential which increases in steplike fashion with each additional pulse. Where the current passed by current source 60 is independent of the potential at node 34 the potential steps will be of equal incremental value, otherwise they will vary as a function of the particular output characteristics of the current source.

The potential at node 21 is sensed by threshold detector 11. Threshold detector 11 may for example be a "Schmitt trigger" or an inverter circuit as illustrated in FIG. 1 which is designed to switch at a particular voltage. Since the potential at 21 increases in discrete increments, the system can be designed to ensure that one incremental potential value added to a previously established potential at 21 is sufficient to cause the output voltage of detector 11 to completely switch between states.

The particular pulsed current source 60 illustrated in FIG. 3 includes high impedance, P-type, enhancement mode field effect transistor 18 which is cyclically turned on and off by a pulsed potential developed at the output of NAND gate 15. The source electrode of transistor 18 is connected to the positive supply at 33 and its drain at node 34. A logic low at its gate electrode 24 conditions transistor 18 to conduct, while a logic high turns 18 off.

The output characteristics of transistor 18 depend upon its geometry and its gate-to-source potential relative to its drain-to-source potential. To attain high output impedance the magnitude of the drain-to source potential must not be less than the gate-to-source potential by more than its threshold or turn-on voltage. A logic low of potential $V_{SS}$ at node 24 in general violates this condition, and will cause transistor 18 to operate in a linear or lower-impedance mode. The effect this has on overall circuit operation is that the potential increments at node 21 will not be of equal amplitude, the potential-time relationship typically following RC characteristics.

A logic low at node 24 which is constrained to a potential slightly less positive than $V_{DD}$ minus a P-threshold will condition 18 to be in saturation when conducting and thereby approximate an ideal current source. NAND gate 15 can be conditioned to provide such a "logic low".

The output of NAND gate 15 nominally swings between the limits of its energizing supply, i.e., the potentials applied to nodes 36 and 37. Interposing a d.c. potential 35 in series with the supply connection at node 36 provides a means of offsetting the "low" potential generated by NAND gate 15, establishing the "low" potential to be at least as large as the potential value of 35 and thereby constraining 18 to conduct in saturation.

NAND gate 15, inverters 12, 13 and 14 and capacitor 29 are arranged as a pulse shaping network having an output that is normally high with negative-going pulses of short duration. The output state of NAND gate 15 is high whenever either of its inputs is low. The single inverter 12, in series with the input connected to node 25, and the two inverters 13 and 14 cascaded in series with the input connected to node 26, guarantee that one or the other input will be low for any static potential applied to terminal 28. The same condition obtains when a pulsed waveform is applied to 28, as for example waveform A in FIG. 4, except for a determinable period following the negative going edges of said waveform. A "high" at node 28 is inverted by 12 creating a "low" on node 25, and simultaneously is twice inverted by 13 and 14 imposing a "high" on node 26. When the potential on node 28 goes low, node 25 goes high after a period required for the signal to propagate through inverter 12, typically less than 50 nano-seconds. In like manner node 26 goes "low" after the propagation delay of inverters 13 and 14 which total propagation time is greater than that of single inverter 12. There exists therefore a period when node 25 has changed to a "high" state before node 26 has gone "low" causing the output of NAND gate 15 to go low. This period is equal to the difference in the propagation delay of the two signal paths connected to the inputs of NAND gate 15. The difference in propagation delay is predictable, and further, is adjustable by the design of the switching points of inverters 13 and 14 and the inclusion of a capacitor 29 at node 27.

The duration of the negative-going pulses available at the output of NAND gate 15 for controlling the conduction of transistor 18 is proportional to the propagation delay of cascaded inverters 13 and 14, as influenced by capacitor 29. This delay increases as capacitor 29 is increased and may be further increased by designing the switching points of inverters 13 and 14 to occur at relatively low and high potentials respectively. These techniques have been well-established in the art so that the durations of the pulses produced at 24 are determinable with reasonable accuracy. Similar results can be obtained with inverters 12 and 14 eliminated from the circuit, but some versatility is sacrificed.

The rate at which the pulses occur is equal to the frequency of the signal applied to node 28. This signal may be a square wave or of some other duty cycle providing the "low" level duration exceeds the duration of the desired pulses of circuit 60.

The average charging current from transistor 18 is controlled by the combination of both the pulse duration of the potential at its gate and the frequency of signal applied to node 28. The average current is a function of the duty cycle of the waveform applied to the gate of 18. Where the dc current capability of transistor 18 is $I_o$ and the duration of the negative-going pulse at node 24 is T, the average current passed to node 34 from transistor 18 is $I_oTf$, where f is the repetition rate of the waveform at node 28 and f is greater than 1/T.

Limiting the average current available to charge capacitor 30 reduces the required size of capacitor 30 for a particular timing application; and makes possible totally integrated devices capable of realizing relatively long delays. The delay in this instance is the minimum time between turning on transistor 19 and the state change of threshold detector 11.

By way of a specific example, consider inverters 12, 13, 14, NAND gate 15 and threshold detector 11 all to switch or change state for an input potential midway between $V_{DD}$ and $V_{SS}$; capacitor 29 to be equal to capacitor 30; the logic levels at node 24 to be equal to those at node 28; and inverter 13 to be a simple CMOS circuit as in FIG. 1 with the conductance of its P-type transistor four times the conductance of transistor 18. The duration of the negative-going pulse applied to the gate of 18 is approximately equal to the time required for the P transistor of 13 to charge capacitor 29 to the switch point of inverter 14. Since the conductance of transistor 18 is one-fourth the value of the P transistor of inverter 13, and the value of capacitor 30 is equal to the value of capacitor 29, four pulses are required for 18 to charge capacitor 30 to the switch point of threshold detector 11. The minimum time transistor 19 must be in continuous conduction to realize a state change at 31 is four periods of the signal applied to 28, i.e., $T_{min}=4/f_{28}$, where $f_{28}$ is the frequency of the waveform at node 28.

Figure 4:
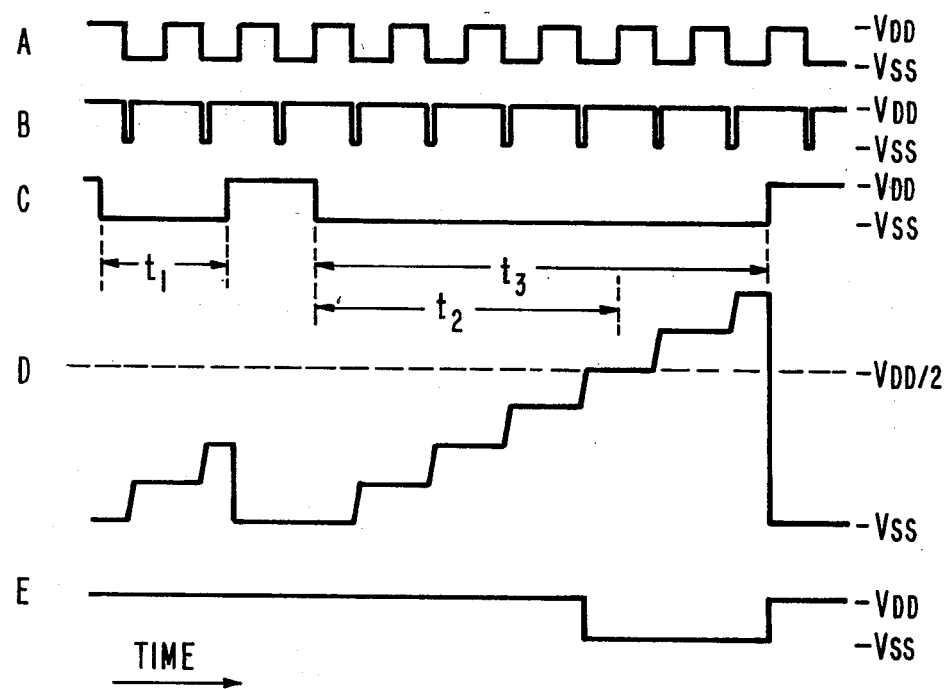
FIG. 4 is a voltage-time diagram for several of the circuit nodes of FIG. 3.

FIG. 4 illustrates the potential-time relationships at several of the circuit nodes in the foregoing example. Waveform A is a periodic square wave applies to node 28, which waveform determines the rate of current pulse occurrence provided from current source 60. Waveform B is the potential at node 24 applied to the gate of transistor 18. The current waveform at node 34 is the complementary waveform to waveform B.

Waveform C is an example of signal applied to input node 23. Pulse period $t_1$ in this waveform is an undesirable, narrow pulse. Period $t_2$ is the minimum pulse period that the circuit of the example is to be responsive to and Period $t_3$ is an arbitrary period. Note that when node 23 is "low", transistor 19 conducts, and threshold detector 11 is designed to switch at $V_{DD}/2$ (for $V_{SS}=0$).

During period $t_1$, transistor 19 conducts for two pulse periods with capacitor 30 attaining two potential increments where each increment has been arbitrarily set at $V_{DD}/8$ as indicated by waveform D. When the potential at node 23 goes high at the end of period $t_1$, the potential on capacitor 30 is reset to zero. During the period $t_2$ transistor 19 conducts for four current pulse periods allowing capacitor to achieve 4 potential increments, the fourth level being sufficient to switch threshold detector 11 from a high to low state as shown by waveform E. When waveform C again goes positive, node 21 is reset low and threshold detector 11 returns to a "high" state. The negative-going transistions of output waveform E are time related to pulses B while the positive-going transitions occur essentially coincident with the positive-going transitions of input waveform C.

An important aspect of the invention where the embodiment of FIG. 3 is assembled on a monolithic die is that the actual values of capacitances and conductances are relatively unimportant in establishing the timing period in contrast to selection of impedance values in a discrete realization of an RC timing circuit. Device elements fabricated on a monolithic die, have relatively uniform parameters, e.g., the threshold voltage of all p-type and n-type transistors are respectively the same, MOS capacitance per unit area is constant over the die, the input-output voltage transfer functions of similar inverters are similar, etc. In addition, transistor conductance and capacitance values are related to their geometries which as is known in the act are accurately definable. These characteristics permit the realization of relatively accurate timing circuits by solely scaling the geometry of the devices in a circuit such as is shown in FIG. 3. With transistor 18 and the p-transistor of inverter 13 having identical conductance characteristics, and inverter 14 and threshold detector 11 conditioned to switch at the same potential, the input pulse width is determinable by scaling the size of capacitor 29 with respect to capacitor 30. On the other hand, the capacitors can be made with equal capacitive values and the input pulse width can be determined by geometrically adjusting the conductance characteristics, $G_1$ and $G_2$, of transistor 18 and inverter 13. The exact value of these parameters is not critical. The ratio of device parameters determines the characteristics of the circuit and the parameter ratios are susceptible of relatively accurate determination by the circuit designer.

Pulsed current source 60 specifically includes inverters 12 and 14 to permit the determination of the charging times at nodes 27 and 21, or alternatively the number of charging pulses required of current source 60 to realize an output transition at node 31, by device scaling or ratio techniques. Inverter 14 is included as a matched device to threshold detector 11. Inverter 13 charging capacitor 29 at the input of inverter 14 establishes a pulse width relative to the device parameters of a particular die. Threshold detector 11 having similar switching characteristics to 14 will be conditioned to change state in relation to the ratio of conductance of transistor 18 to inverter 13 and the ratio of the value of capacitor 27 to capacitor 30. Inverter 12 is required to effect a necessary phase change due to the inclusion of inverter 14.

The embodiment of FIG. 3 admits to a large number of design variations to realize the period a signal must be present on input 23 before a transition will occur at output 31. These variations generally include the selection of a ratio between the capacitances of capacitors 29 and 30, the conductance ratio of transistor 18 to inverter 13 and the switching points of the several elements, making the embodiment a highly versatile circuit.

The invention is shown in a specific embodiment but it will be understood that various omissions and substitutions and changes in form and details of the device may be made by those skilled in the art and armed with the foregoing disclosure, without departing from the spirit of the invention, and the following claims should be construed accordingly.

What I claim is:

1. A narrow pulse eliminator comprising:
   input and output terminals, said input terminal receptive of a signal alternating between first and second states defining input signal pulses of differing time duration;
   a first capacitor having a first plate connected a point of reference potential and having a second plate connected to a first node;
   a threshold detector having an input connected to said first node and having an output connected to said output terminal;
   a pulsed current source, responsive to a pulsed signal of a prescribed frequency, for supplying predetermined current pulses at intervals related to said prescribed frequency;
   switch means responsive to said input signal on said input terminal for connecting said first node to said pulsed current source when said input signal is in said first state so that said predetermined current pulses accumulate charge on said first capacitor, and for connecting said first node to a point of constant potential, relative to said reference potential, when said input signal is in said second state so that substantially all of said accumulated charge is dissipated;
   wherein said threshold detector provides an output indication responsive to only those input signal pulses which exceed a specified pulse duration in said first state long enough for said pulsed current source to charge said first capacitor to a voltage level exceeding the threshold of said threshold detector.

2. A narrow pulse eliminator according to claim 1 wherein
   said pulsed current source is driven by a source of pulsed potential which includes a second capacitor wherein the magnitude of each of said predetermined current pulses is proportional to the value of said second capacitor; and wherein said specified pulse duration for which said threshold detector provides said output indication, is proportional to the ratio of the respective values of said first and second capacitors.

3. A narrow pulse eliminator as set forth in claim 1 wherein said switch means comprises:
a first field effect transistor of a first conductivity type having a source electrode connected to said point of reference potential and having drain and gate electrodes;
a second field effect transistor of a second conductivity type complementary to said first conductivity type having a source electrode connected to said first node, and having a gate and drain electrodes;
means connecting the gate electrodes of said first and second transistors to said second node for receiving said input signal;
means connecting the drain electrodes of said first and second transistors to an interconnection of the second plate of said first capacitor and an input terminal of said threshold detection means.

4. A narrow pulse eliminator as set forth in claims 1 or 3 wherein said pulsed current source comprises;
a current sourcing field effect transistor having a first electrode connected to a point of direct current potential different from said reference potential, a second electrode connected to said first node, and having a control electrode, which transistor is conditioned to conduct current by a potential applied between its first and control electrodes;
means providing a pulsed potential connected to the control electrode of said current sourcing transistor, which potential pulses having a determinable duration and a determinable repetition rate for controlling the average charging current of said current sourcing transistor.

5. A narrow pulse eliminator comprising:
means selectively conductive for supplying current, when conductive, to a first node;
said selectively conductive means including a current sourcing transistor having a first electrode connected to a point of direct current potential different from said reference potential, a second electrode connected to said first node, and having a control electrode, which transistor is conditioned to conduct current by a potential applied between its first and control electrodes;
means providing a pulsed potential connected to the control electrode of said current sourcing transistor, which potential pulses having a determinable duration and a determinable repetition rate for controlling the average charging current of said current sourcing transistor;
a first capacitance having a first plate connected to a point of reference potential and having a second plate;
a second node for receiving an input signal alternating between first and second states;
switch means responsive to the first state of said input signal to connect the second plate of said first capacitance to said first node for accumulating charge related to the duration for which said input signal is in the first state, and responsive to the second state of said input signal to connect the second plate of said first capacitance to a point of constant potential, relative to said reference potential, for dissipating said accumulated charge;
threshold detection means responsive to the potential at the second plate of said first capacitance for supplying an indication of whether or not the charge on said capacitance exceeds a predetermined level indicative of the input signal being in its first state for longer than a specified duration; wherein said means providing a pulsed potential comprises:
first, second and third inverter means having respective input and output electrodes;
a NAND gate circuit having first and second input electrodes connected respectively to the output electrodes of said first and third inverter means, and having an output electrode connected to the control electrode of said current sourcing transistor;
a second capacitance connected between said point of reference potential and an interconnection of the output electrode of said second inverter means and the input electrode of said third inverter means, for delaying the output response of said second inverter means; and
a terminal connected to the input electrodes of said first and second inverter means for receiving a repetitive signal of determinable repetition rate.

6. A narrow pulse eliminator as set forth in claim 5 wherein said threshold detection means comprises a complementary field effect transistor pair having output and input connections respectively at a common connection of their drain electrodes and a common connection of their gate electrodes, and which complementary transistor pair is connected between said reference potential and said point of direct current potential different from said reference potential.

7. A narrow pulse eliminator as set forth in claim 6 wherein
said second inverter means comprises a complementary field effect transistor pair having their conduction paths serially connected via a common drain connection at its output electrode, and having their gate electrodes connected to the input electrode, and wherein
the value of said first and second capacitances are respectively $C_1$ and $C_2$, and wherein
geometric parameters relating to the conductance of said current sourcing transistor, a field effect transistor, are subsumed in a single factor designated $G_1$, and wherein
geometric parameters relating to the conductance of the transistor of said second inverter which is of the same conductivity type as said current sourcing field effect transistor are subsumed in a single factor designated $G_2$, and wherein
the frequency of the repetitive signal applied to the input electrode of said first and second inverters is designated f, and wherein
said threshold detection means and said third inverter means respond similarly to like potentials applied to their inputs,
the minimum pulse duration, $T_m$, applied as an input signal to said second node to which said threshold detection means will be responsive is related to the aforementioned parameters by the equation $T_m = C_1 G_2/(C_2 G_1 f)$

* * * * *